United States Patent
Slater, Jr. et al.

(10) Patent No.: US 7,291,529 B2
(45) Date of Patent: Nov. 6, 2007

(54) METHODS OF PROCESSING SEMICONDUCTOR WAFER BACKSIDES HAVING LIGHT EMITTING DEVICES (LEDS) THEREON

(75) Inventors: David B. Slater, Jr., Durham, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 363 days.

(21) Appl. No.: 10/987,135

(22) Filed: Nov. 12, 2004

(65) Prior Publication Data

US 2005/0151138 A1     Jul. 14, 2005

Related U.S. Application Data

(60) Provisional application No. 60/519,396, filed on Nov. 12, 2003.

(51) Int. Cl.
  *H01L 21/00*     (2006.01)
(52) U.S. Cl. .................. 438/200; 438/22; 438/39
(58) Field of Classification Search .............. 438/22, 438/39, 200
  See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,087,949 A | 2/1992 | Haitz |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 5,994,205 A | 11/1999 | Yamamoto et al. |
| 6,120,600 A | 9/2000 | Edmond et al. |

(Continued)

FOREIGN PATENT DOCUMENTS

JP     2000-022213 A     1/2000

(Continued)

OTHER PUBLICATIONS

International Search Report and the Written Opinion of the International Searching Authority for International patent application PCT/US2004/037934 mailed on Jul. 13, 2005.

(Continued)

*Primary Examiner*—Laura M. Schillinger
(74) *Attorney, Agent, or Firm*—Myers, Bigel, Sibley & Sajovec, P.A.

(57) ABSTRACT

Processing a semiconductor wafer can include forming a plurality of Light Emitting Devices (LED) on a semiconductor wafer having a first thickness. The plurality of LEDs on the wafer are brought into contact with a surface of a carrier to couple the wafer to the carrier. The first thickness of the wafer is reduced to a second thickness that is less than the first thickness by processing the backside of the wafer. The carrier is separated from the plurality of LEDs on the wafer and the wafer is cut to separate the plurality of LEDs from one another. Related devices are also disclosed.

25 Claims, 6 Drawing Sheets

U.S. PATENT DOCUMENTS

| | | | |
|---|---|---|---|
| 6,187,606 B1 | 2/2001 | Edmond et al. | |
| 6,197,609 B1 * | 3/2001 | Tsutsui et al. | 438/33 |
| 6,201,262 B1 | 3/2001 | Edmond et al. | |
| 6,649,017 B1 * | 11/2003 | Kurokawa | 156/344 |
| 6,740,906 B2 * | 5/2004 | Slater et al. | 257/99 |
| 6,791,119 B2 * | 9/2004 | Slater et al. | 257/99 |
| 6,794,684 B2 * | 9/2004 | Slater et al. | 257/77 |
| 6,803,243 B2 * | 10/2004 | Slater et al. | 438/20 |
| 6,818,532 B2 * | 11/2004 | Yeom et al. | 438/460 |
| 6,869,819 B2 * | 3/2005 | Watanabe et al. | 438/69 |
| 6,884,644 B1 * | 4/2005 | Slater et al. | 438/20 |
| 6,909,119 B2 * | 6/2005 | Slater et al. | 257/77 |
| 7,026,659 B2 * | 4/2006 | Slater et al. | 257/98 |
| 7,037,742 B2 * | 5/2006 | Slater et al. | 438/39 |
| 2002/0076904 A1 * | 6/2002 | Imler | 438/462 |
| 2002/0113235 A1 * | 8/2002 | Udagawa | 257/59 |
| 2002/0123164 A1 * | 9/2002 | Slater et al. | 438/39 |
| 2002/0179910 A1 * | 12/2002 | Slater, Jr. | 257/77 |
| 2003/0006418 A1 | 1/2003 | Emerson et al. | |
| 2003/0168663 A1 * | 9/2003 | Slater et al. | 257/77 |
| 2004/0056260 A1 | 3/2004 | Slater, Jr. et al. | |
| 2004/0171204 A1 * | 9/2004 | Slater et al. | 438/200 |
| 2004/0217362 A1 * | 11/2004 | Slater et al. | 257/79 |
| 2005/0104072 A1 * | 5/2005 | Slater et al. | 257/77 |
| 2005/0151138 A1 * | 7/2005 | Slater et al. | 257/79 |
| 2006/0131599 A1 * | 6/2006 | Slater et al. | 257/98 |

FOREIGN PATENT DOCUMENTS

| | | |
|---|---|---|
| WO | WO 02/082502 A | 10/2002 |

OTHER PUBLICATIONS

U.S. Appl. No. 60/495,189, filed Aug. 11, 2004, Slater, Jr. et al.
U.S. Appl. No. 10/815,293, filed Apr. 1, 2004, Donofrio.
Boehlen et al., "Laser micro-machining of high density optical structures on large substrates," Exitech Ltd., Admitted Prior Art, 2004.

* cited by examiner

METHODS OF PROCESSING SEMICONDUCTOR WAFER BACKSIDES HAVING LIGHT EMITTING DEVICES (LEDS) THEREON

CROSS-REFERENCE TO PROVISIONAL APPLICATION

This application claims the benefit of U.S. Provisional Application No. 60/519,396; filed Nov. 12, 2003, entitled LED with Reduced Thickness Substrate, which is assigned to the assignee of the present application, the entire disclosure of which is incorporated herein by reference.

FIELD OF THE INVENTION

This invention relates to microelectronic devices, and more particularly, to the fabrication of light emitting devices (LEDs) and LEDs so formed.

BACKGROUND

It is known that the thickness of Silicon-carbide (SiC) substrates in SiC-based light emitting devices can affect the forward voltage needed to operate the devices at a given current level. For example, the SiC-based light emitting diode C450-CB230-E1000 available from Cree, Inc. has a substrate thickness of about 250 µm (+/−25 µm) and has an associated forward operating voltage of about 3.5 volts at about 20 mA forward operating current. Moreover, reducing the thickness of the SiC substrate of an LED may reduce the forward voltage, which may yield reduced power consumption in such diodes.

It is also known that many small electronic devices may incorporate individual devices having reduced thicknesses so that the overall thickness of the electronic device may be reduced. For example, manufacturers of cellular phones may use surface-mounted LED chips to reduce the thickness of the component used to backlight a display of the cellular phone. Accordingly, reducing the thickness of the SiC substrate may also allow the device to be used in these types of small electronic devices.

It is known to form ohmic contacts on SiC at low/room temperature by, for example, implanting ions into a backside of a SiC wafer. However, if an implanted SiC substrate is thinned prior to formation of ohmic contacts, the doped region may be removed during the thinning, which may make the implant superfluous. Accordingly, metals deposited form ohmic contacts may not have ohmic properties when deposited on the substrate as the implant may be performed in a later step. Ion implantation for the formation of ohmic contacts is discussed, for example, in U.S. patent application Ser. No. 09/787,189, and in U.S. Patent Publication No. US 2002/0179910, the disclosures of which are incorporated herein by reference in their entireties as if set forth fully herein.

It is also known to form metal ohmic contacts by depositing a metal, such as nickel, and annealing the metal at a high temperature (such as temperatures greater than 900 C). High temperature annealing may damage epitaxial layers of gallium nitride based materials included on the SiC substrate.

SUMMARY

Figure 1:
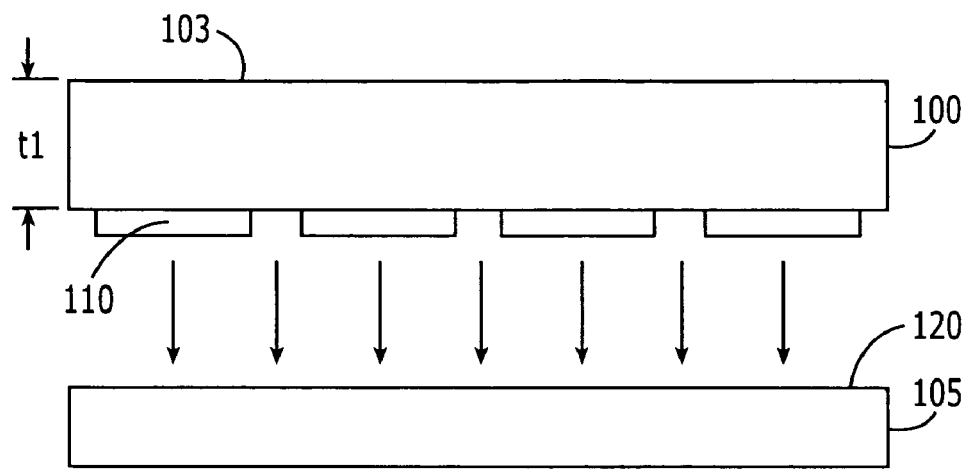
FIGS. 1-7 are cross-sectional illustrations that illustrate methods of processing semiconductor wafers according to some embodiments of the invention.

Embodiments according to the invention can provide methods of processing semiconductor wafer backsides having light emitting devices (LEDs) thereon and LEDs so formed. Pursuant to these embodiments, a method of processing a semiconductor wafer can include forming a plurality of Light Emitting Devices (LED) on a semiconductor wafer having a first thickness. The plurality of LEDs on the wafer are coupled to a carrier. The first thickness of the wafer is reduced to a second thickness that is less than the first thickness by processing the backside of the wafer. The carrier is separated from the plurality of LEDs on the wafer and the wafer is cut to separate the plurality of LEDs from one another.

In some embodiments according to the invention, the first thickness is from about 250 µm to about 400 µm. In some embodiments according to the invention, reducing the first thickness of the wafer includes grinding, lapping, and/or etching the backside of the wafer to reduce the first thickness of the wafer to the second thickness of less than about 150 µm. In some embodiments according to the invention, reducing the first thickness of the wafer includes grinding, lapping, and/or etching the backside of the wafer to reduce the first thickness of the wafer to the second thickness of less than about 120 µm. In some embodiments according to the invention, grinding the backside of the wafer includes grinding the backside of the wafer using an in-feed grinder or a creep feed grinder.

In some embodiments according to the invention, cutting the wafer includes cutting the wafer using a saw blade to form straight edges on the separated plurality of LEDs. In some embodiments according to the invention, cutting the wafer includes cutting score lines on the wafer to form beveled grooves between the plurality of LEDs on the wafer and separating the plurality of LEDs on the wafer from one another along the score lines. In some embodiments according to the invention, cutting the wafer includes cutting the wafer with a saw blade to depth beneath a surface of the wafer of less than about a length of a beveled tip of the saw blade. In some embodiments according to the invention, the depth is less than about 120 µm.

In some embodiments according to the invention, reducing the first thickness of the wafer to a second thickness is followed by processing the backside surface of the wafer opposite the plurality of LEDs to improve light extraction. A plurality of respective contacts are formed on the backside surface opposite where respective bonding pads are to be formed on the plurality of LEDs. In some embodiments according to the invention, forming a plurality of respective contacts includes forming a plurality of ohmic contacts using laser annealing.

In some embodiments according to the invention, processing includes etching the backside surface. In some embodiments according to the invention, processing includes laser patterning the backside surface.

In some embodiments according to the invention, separating the carrier from the plurality of LEDs on the wafer includes heating, dissolving, or melting an adhesive layer sufficient to cause separation of the plurality of LEDs from the carrier. In some embodiments according to the invention, the wafer is a Silicon Carbide or sapphire wafer.

In some embodiments according to the invention, a light emitting device (LED) on a Silicon Carbide (SiC) substrate has a first thickness of less than about 150 µm. In some embodiments according to the invention, a forward voltage associated with the SiC substrate is about 3.4 volts. In some embodiments according to the invention, the SiC substrate is 4H—SiC or 6H—SiC.

DESCRIPTION OF EMBODIMENTS ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies). For example, in some embodiments according to the invention, an ohmic contact can be a contact with a specific contact resistivity of less than about 10 e-03 ohm-cm$^2$ and, in some embodiments less than about 10 e-04 ohm-cm$^2$. Thus, a contact that is rectifying or that has a high specific contact resistivity, for example, a specific contact resistivity of greater than about 10 e-03 ohm-cm$^2$, is not an ohmic contact as that term is used herein.

Light emitting devices (LEDs) described herein may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide, GaN and/or other microelectronic substrates, and one or more contact layers which may include metal and/or other conductive layers. In some embodiments, ultraviolet, blue and/or green LEDs may be provided.

It will be understood by those having skill in the art that many embodiments of the invention maybe employed with many different combinations of substrate and epitaxial layers. For example, other combinations can include AlGaInP diodes on GaP substrates; InGaAs diodes on GaAs substrates; AlGaAs diodes on GaAs substrates; Silicon Carbide (SiC) diodes on SiC or sapphire (Al2O3) substrate; and/or nitride-based diodes on gallium nitride, silicon carbide, aluminum nitride, sapphire, zinc oxide and/or other substrates.

In particular, the LEDs may be devices manufactured and sold by Cree, Inc. of Durham, N.C. The invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. US 2004/0056260, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

As described herein below in greater detail, embodiments according to the invention can provide methods of processing semiconductor wafers of light emitting devices by, for example, reducing a thickness of the wafer having light emitting devices (LEDs) mounted thereon by processing the wafer from a backside thereof. The wafer can be thinned to a thickness that allows a partially inserted beveled tip of a saw blade to cut beneath the surface of the wafer sufficiently deep to allow the plurality of LEDs thereon to be separated from one another by breaking the remaining uncut portion of the wafer. In particular, the wafer may be cut to a level beneath the surface that is less than the length of the beveled tip of the saw blade so that straight edges of the saw blade remain exposed (or above) the surface of the wafer. In other words, the partial insertion of the beveled tip of the saw blade may cut deep enough into the wafer to allow the plurality of LEDs to be separated from one another by breaking the wafer along the score lines formed by the partial insertion of the beveled tip.

Therefore, the backside 103 of the wafer 100' can be thinned sufficiently to allow the plurality of LEDs on the wafer to be separated from one another by partial insertion of the beveled tip of the saw blade. Partially inserting the beveled tip of the saw blade can avoid the formation of otherwise detrimental geometries while still allowing the plurality to be separated from one another due to the reduced thinness of the wafer.

As shown in FIG. 1, a wafer (i.e., a substrate) 100 has a thickness (t1) of about 250 microns to about 400 microns. A plurality of light emitting devices (LED) 110 are formed on a surface of the wafer 100 that is opposite a backside 103 of the wafer 100. It will be understood that the plurality of LEDs can be GaN-based light emitting diodes that typically comprise an insulating or semiconducting substrate (or wafer) such as SiC or sapphire on which a plurality of GaN-based epitaxial layers are deposited. The epitaxial layers comprise an active region having a p-n junction that emits light when energized. In some embodiments according to the invention, the wafer is a SiC wafer of 4H—SIC, 6H—SiC or another type of material known to those skilled in the art.

Figure 2:
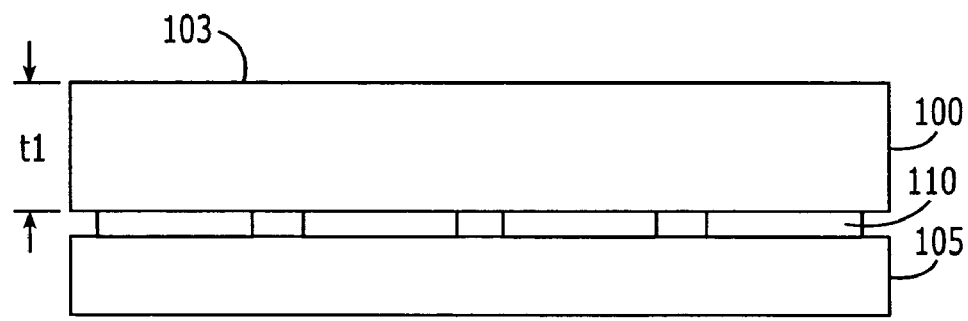

According to FIG. 2, in some embodiments according to the invention, a wafer 100 (including the plurality of LEDs 110) and a wafer carrier 105 are coupled together via an adhesive layer 120 in contact with the plurality of LEDs so that the entire assembly can be subject to processing by, for example, mounting the wafer carrier 105 in a grinder so that the backside 103 of the wafer 100 can be accessed. It will be understood that the wafer 100/plurality of LEDs 110 can be coupled to the wafer carrier 105 using any technique known to those skilled in the art, such as a wax, and may be applied to the plurality of LEDs or to the wafer carrier. It will be further understood that the term "contact" includes direct contact as well as indirect contact where, for example, one or more intervening elements (such as the adhesive layer described above) are present between the plurality of LEDs and the wafer so that these two elements can be coupled together and the backside of the wafer can be processed while holding the carrier.

Figure 3:
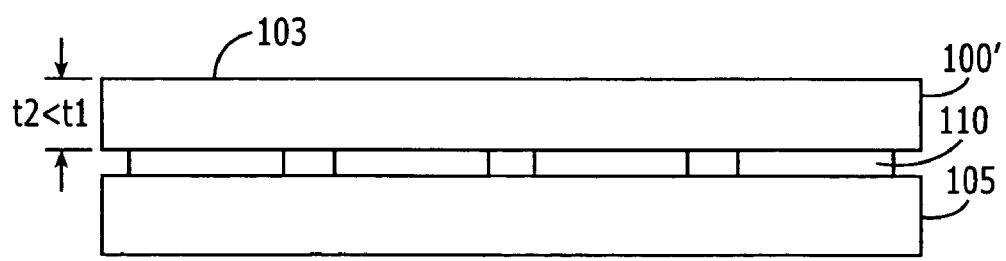

According to FIG. 3, in some embodiments according to the invention, the backside 103 of the wafer 100 is processed to reduce the wafer 100 to a thickness t2, which is less than t1, to form a thinned wafer 100'. It will be understood that the thickness t2 is less than t1 to allow a saw blade having a beveled tip to cut beneath the surface of the backside 103 to a depth less than about a length of the bevel of the tip of the saw blade. Accordingly, the beveled tip is partially inserted into the backside 103 so that straight edges of the saw blade can remain exposed above the backside 103.

In some embodiments according to the invention, the thickness of the wafer 100 is reduced using a grinder, such as an in-feed or creep feed grinder. In other embodiments according to the invention, the thickness of the wafer 100 is reduced using lapping, chemical or reactive ion etching or combinations of these approaches with or without grinding. In still other embodiments according to the invention, etching may be used to treat the backside of the thinned wafer (i.e., after thinning the wafer) to reduce damage to the wafer so that growth of epi-layers may be improved.

It will be understood that although the embodiments described above refer to partial insertion of the beveled tip (so that the straight edges of the saw blade can remain exposed), in some embodiments according to the invention, the beveled tip may be inserted farther so that a small portion of the straight edges of the saw blade are inserted below the surface of the thinned wafer 100'. It will be further understood that the LEDs so formed may still provide the substantially the same benefits as those embodiments where the beveled tip is partially inserted (such as improved light extraction and improved conformal deposition of a phosphor coating thereon). Accordingly, embodiments where a small portion of the straight edges of the saw blade are inserted below the surface of the thinned wafer 100' will be understood to be within the scope of the claimed subject matter.

In some embodiments according to the invention, the wafer 100 is thinned to a thickness of less than about 150 microns. In other embodiments according to the invention, the wafer 100 is thinned to a thickness of less than about 120 microns. In some embodiments according to the invention, the wafer 100 is thinned using an in-feed grinder or a creep-feed grinder.

Figure 4:
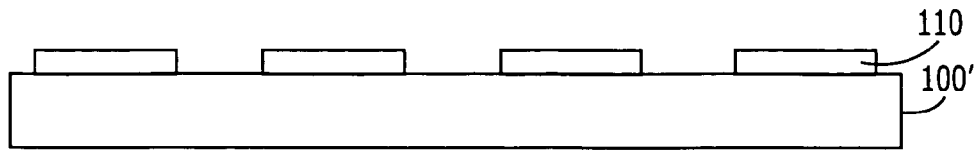

The partial insertion of the beveled tip coupled with the reduced thickness of the thinned wafer 100' allows the plurality of LEDs to be separated from one another by, for example, breaking the thinned wafer 100' rather than cutting through the entire wafer. Once the backside 103 has been processed to sufficiently thin the wafer 100', the wafer carrier 105 can be removed from the assembly by, for example, heating the adhesive layer 120 so that the thinned wafer 100' and the plurality of LEDs thereon may be removed as shown in FIG. 4. In other embodiments according to the invention, the wafer carrier 105 can be removed from the assembly using an appropriate based on the structure used to couple these elements as shown above in reference, for example, to FIG. 2. For example, the structure may be dissolved or melted to separate the wafer carrier 105 from the assembly.

Figure 5:
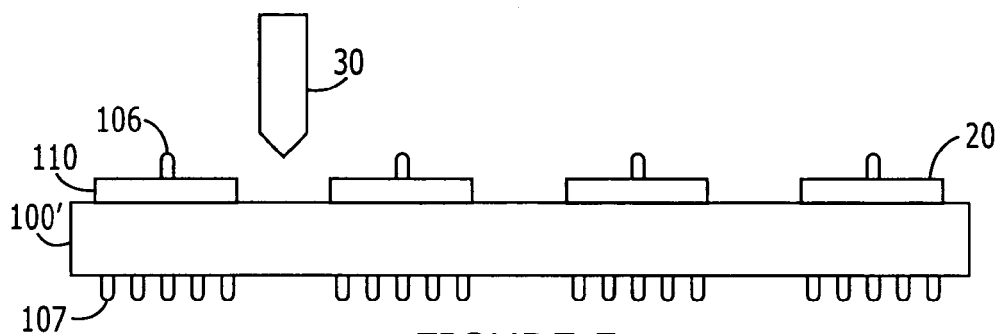

Ohmic contacts 107 can be formed on the backside 103 of the wafer 100' using, for example, laser annealing as discussed in U.S. patent application Ser. No. 10/916,113, entitled Localized Annealing of Metal-Silicon Carbide Ohmic Contacts and Devices So Formed to Slater et al., filed Aug. 11, 2004, which is commonly assigned to the present Assignee, the disclosure of which is incorporated herein by reference. It will be understood that the ohmic contacts can be formed on the thinned wafer 100' while the wafer is coupled to the wafer carrier. In some embodiments according to the invention, the ohmic contacts can be formed on the thinned wafer 100' after the wafer is removed from the wafer carrier, as shown for example, in FIG. 5. Bonding pads 106 can be formed on the plurality of LEDs 110 opposite the ohmic contacts. A saw blade 30 can be used to cut the wafer 100' to separate the plurality of LEDs for packaging. It will be understood that the saw blade 30 can cut through the entire wafer 100' to form straight edges on the thinned wafer 100' between the separated plurality of LEDs 110 or substantially through the thinned wafer 100' so that the LEDs 110 may be separated from one another by applying pressure along the score lines formed by the saw blade 30.

Figure 6:
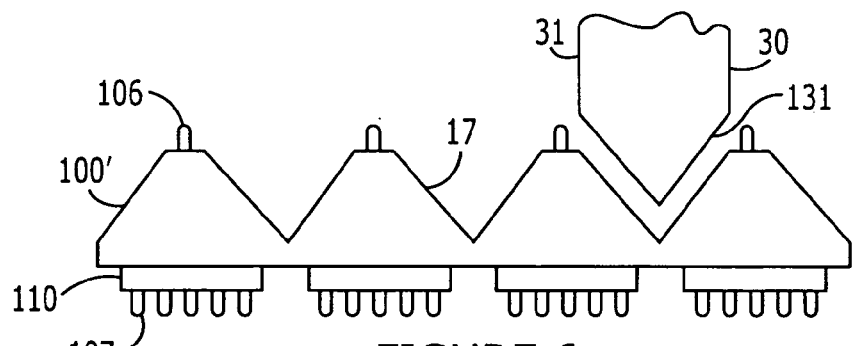
Figure 7:
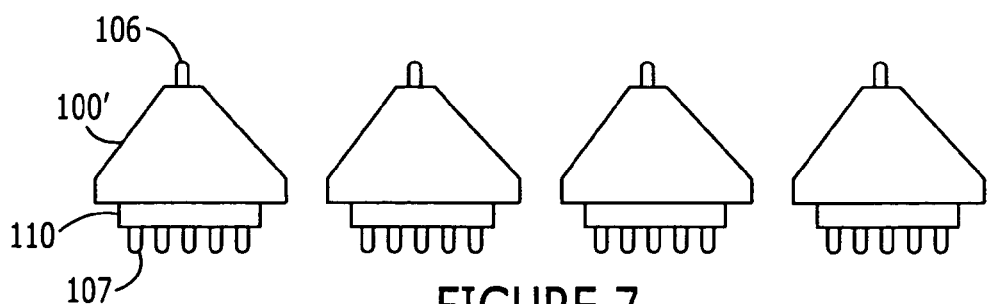

In other embodiments according to the invention as illustrated in FIG. 6, the saw blade 30 is partially inserted into the thinned wafer 100' to a depth that is less than the length of the beveled tip 131 to form beveled grooves 17 in the thinned wafer 100'. The saw 30 is partially inserted into the thinned wafer 100' so that the straight edges 31 of the saw 30 remain exposed when the beveled tip 131 is partially inserted to avoid the formation of undesirable geometries in the thinned wafer 100' above the beveled grooves 17. Moreover, the thickness of the thinned wafer 100' allows the beveled groves 17 to penetrate sufficiently into the thinned wafer 110' so that the plurality of LEDs can be separated from one another by breaking the thinned wafer 100' along grooves (or score lines) as shown in FIG. 7. Furthermore, as discussed above in reference to FIG. 5, bonding pads 106 and ohmic contacts 107 can be formed on the plurality of LEDs.

In further aspects according to embodiments of the invention, the backside 103 of the wafer 100' can be processed to further improve light extraction from the LED including patterning the backside 103 with a laser or by what is commonly referred to as "roughing." The laser patterning may be provided in a single or step-wise fashion. By patterning the backside 103, light extraction may be improved, for example, by providing a randomization pattern thereon. Embodiments of the invention may be particularly well suited to larger area devices where the effectiveness of angled sidewalls of the wafer 100' may be reduced because of the surface area of the device. Furthermore, one or both of the opposing faces of the wafer 100' (i.e., a front side and the backside 103) may be patterned. The wafer 100' may be patterned using a laser patterning system such as that described in U.S. patent application Ser. No. 10/815,293, entitled Laser Patterning of Light Emitting Devices and Patterned Light Emitting Devices to Donofrio, filed Apr. 1, 2004, the entire disclosure of which is incorporated herein by reference.

In some embodiments of the invention, the laser used to pattern the wafer 100' is an excimer pulsed laser, however any laser system suitable for removing material from the substrate may be used. For example, the laser system could be a frequency tripled and/or quadrupled YAG laser. In certain embodiments of the invention, the laser has a wavelength of 308 nm, however, other wavelengths, such as 248 nm, 193 nm, 157 nm, 355 nm or 266 nm could also be used. Additionally, assist processes known to those of skill in the art could also be employed to mitigate surface damage and/or enhance laser absorption, such as water mist and/or assist gases. Multiple pulses of the laser may be used to remove material from the substrate. Any energy suitable for controllably removing material from the substrate may be used. For example, a pulsed 308 nm laser of about 4.2 J/pulse may be used in certain embodiments of the present invention.

Figure 8:
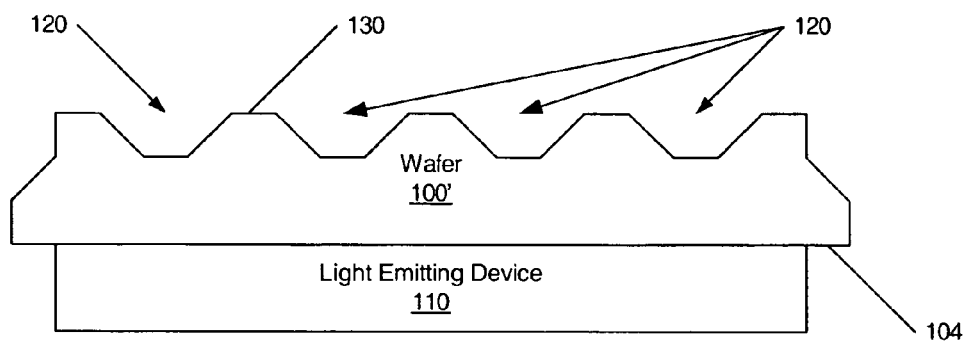
FIGS. 8 and 9 are a cross-sectional view and an isometric view of a light emitting device having a laser patterned wafer according to various embodiments of the invention.
Figure 9:
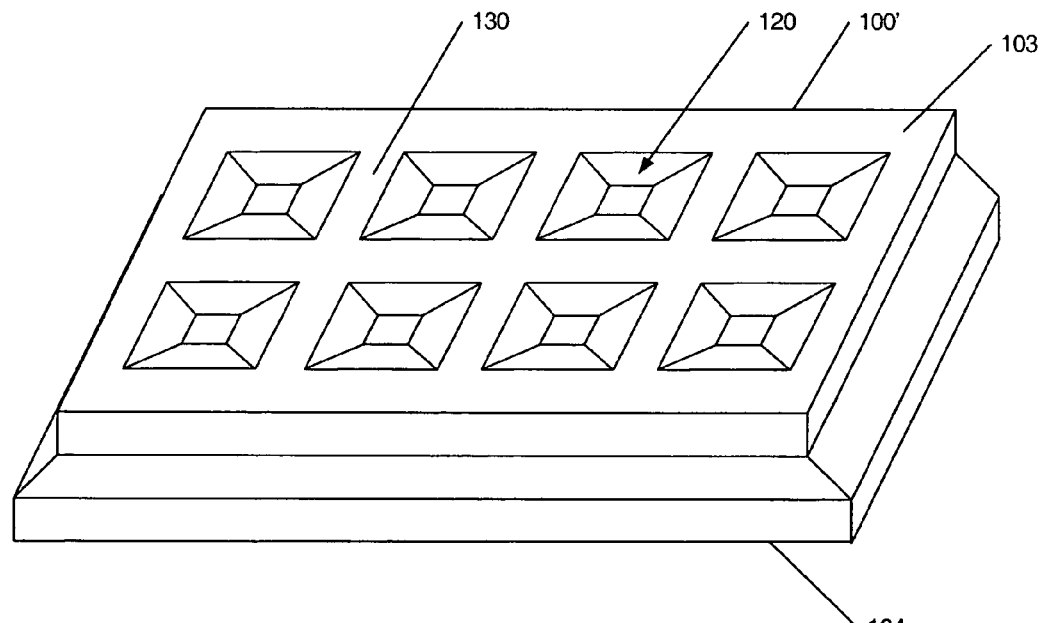

FIG. 8 is a cross-sectional view of an LED on the wafer 100' having the backside 103 laser patterned according to some embodiments of the invention. FIG. 9 is an isometric pictorial view of the light-emitting device of FIG. 8. Three-dimensional patterns 120 are formed in the backside 103 using a laser as described above. In the embodiments illustrated in FIGS. 8 and 9, the LED 110 is formed on an opposite side 104 (i.e., front side) of the wafer 100'. As is seen in FIGS. 8 and 9, the patterns 120 are surrounded by an uninterrupted perimeter 130 on the backside 103 of the wafer 100.

Figure 10:
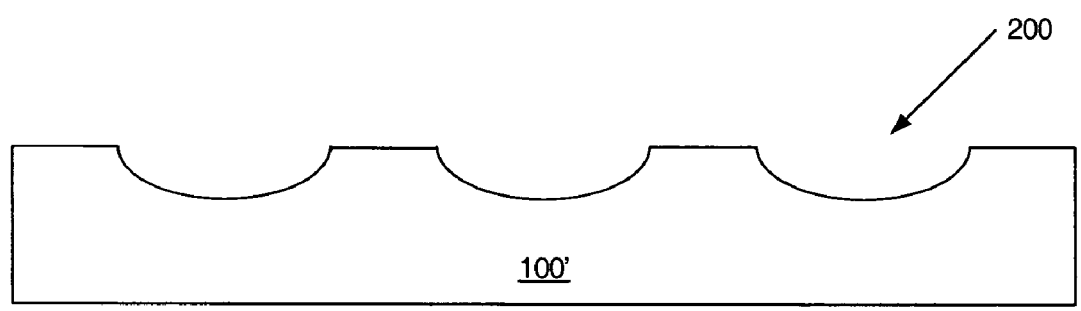
FIGS. 10 through 13 are cross-sectional views of laser patterned wafers according to alternative embodiments of the invention.
Figure 11:
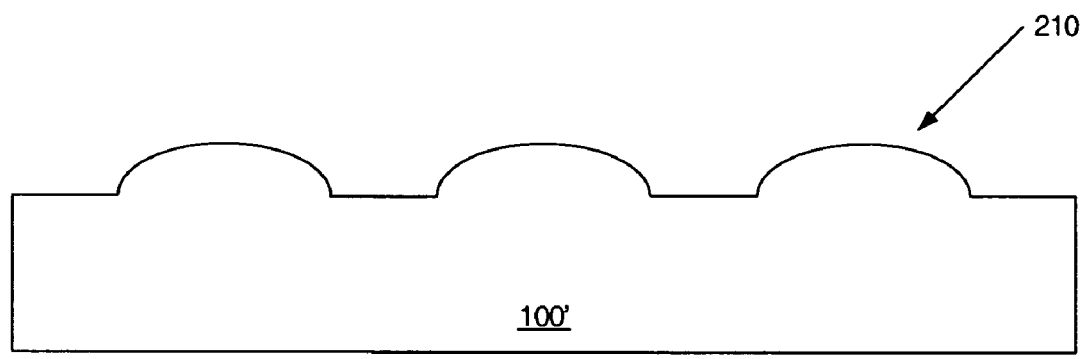

FIGS. 10 and 11 are cross-sectional views of wafers 100' according to further embodiments of the present invention. As seen in FIGS. 10 and 11, in cross-section, curved surfaces extending into 200 or protruding 210 from the wafer 100' may be provided by laser patterning. The curved surfaces 200, 210 may include a parabolic curve. Such a curve may be provided, for example, by controlling the laser light using a series of masks that provided the selective removal of substrate material to provide the parabolic structures. In certain embodiments of the present invention, the curved surfaces may provide lenses in the substrate. In other embodiments of the present invention, the curved surfaces may provide a sinusoidal pattern of grooves.

While multiple curved structures are illustrated in FIGS. 10 and 11, the wafer 100' could be shaped to a single curve so as to provide a curved wafer 100'. The curved wafer 100' may be curved on both faces. Also, the light emitting device could be provided on the curved surface of the wafer 100'.

Figure 12:
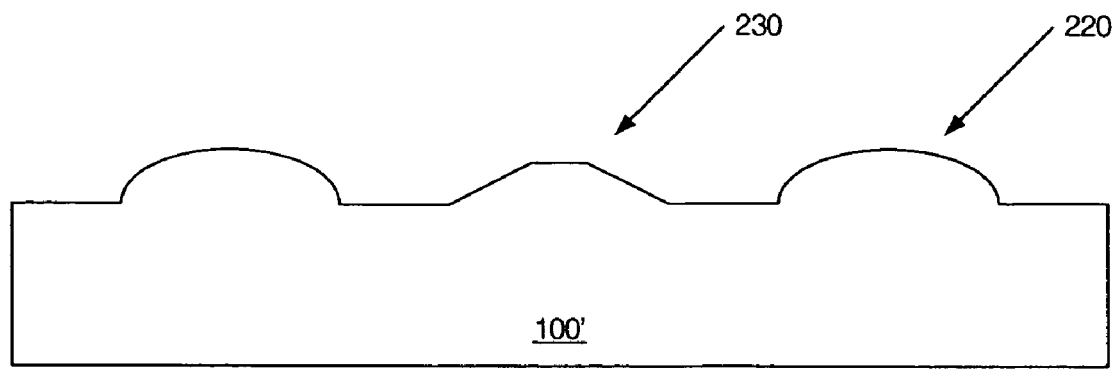
Figure 13:
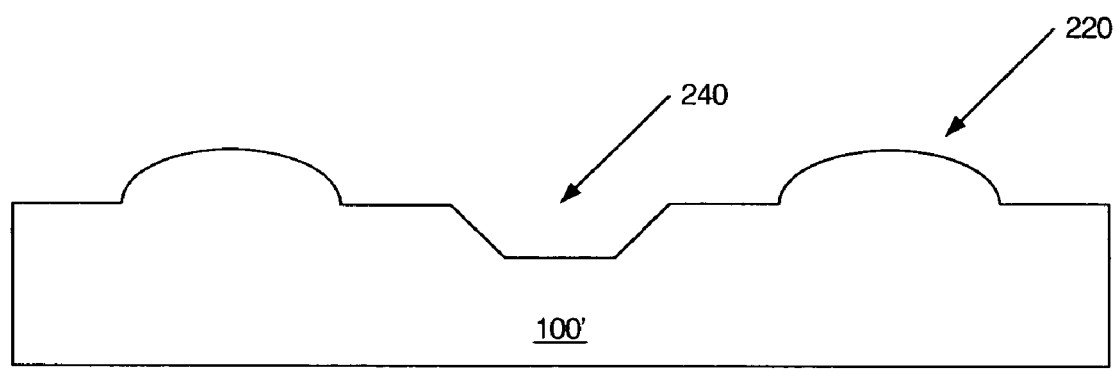

FIGS. 12 and 13 are cross-sectional views of wafers 100' according to further embodiments of the invention. As seen in FIGS. 12 and 13, combinations of curved 220 and non-curved features 230, 240 may be provided in a single wafer 100'. Thus, embodiments of the invention may include multiple different three-dimensional geometric patterns in a single wafer 100'.

Figure 14:
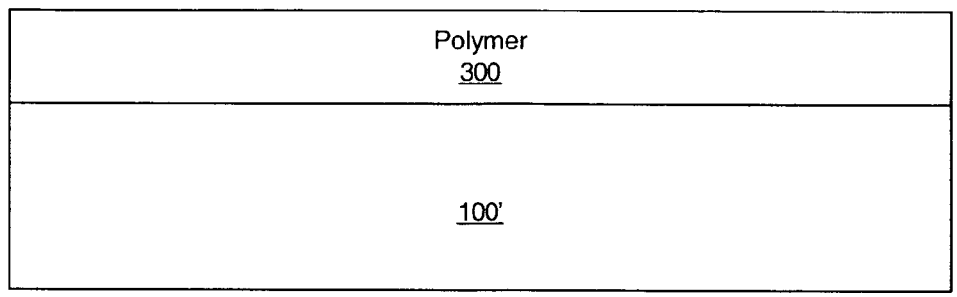
FIGS. 14 through 16 are cross-sectional view illustrating operations according to laser patterning techniques according to alternative embodiments of the invention.
Figure 15:
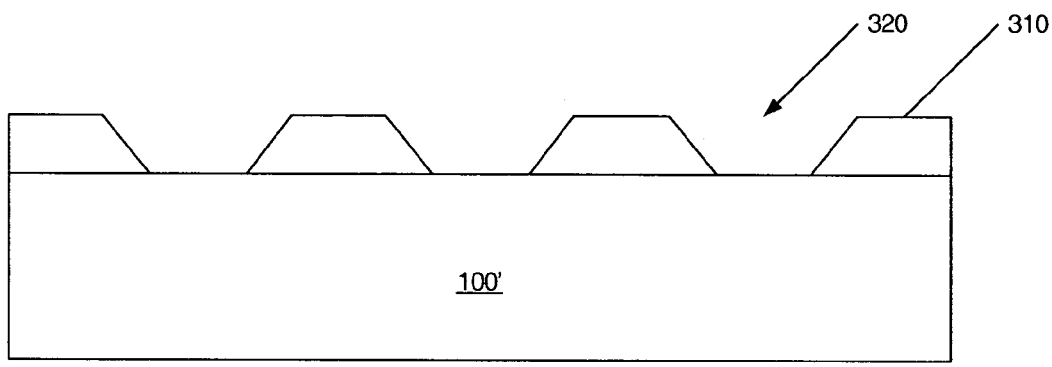
Figure 16:
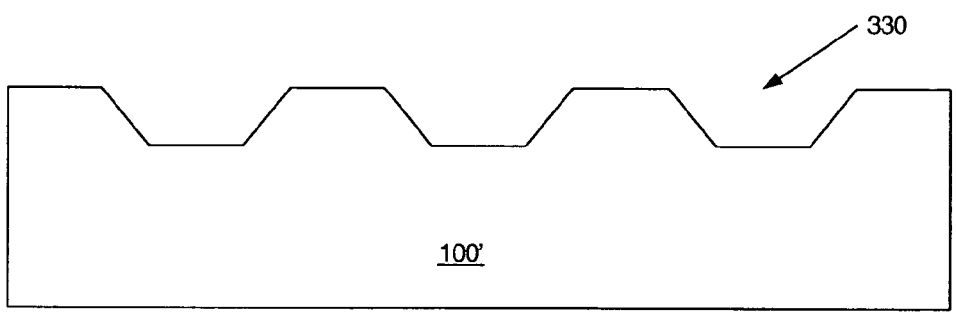

FIGS. 14 through 16 illustrate alternative embodiments for laser patterning according to some embodiments of the invention. As seen in FIG. 14, a polymer mask layer 300 may be provided on the wafer 100'. In FIG. 15, the polymer mask layer 300 is laser patterned to provide a polymer mask 310 having three-dimensional features 320 corresponding to features to be provided in the wafer 100'. In FIG. 16, the mask 310 is used as an etch mask and the wafer 100' is etched to provide the three-dimensional features 330. The etch may, for example, be a dry etch. Conventional polymer masks and techniques for etching using polymer masks may be used. Additionally, other mask materials that may be laser patterned could also be used.

Techniques for laser patterning a polymer layer are known to those of skill in the art. For example, such techniques are described in "Laser micro-machining of high density optical structures on large substrates" by Boehlen et al. of Exitech Ltd. In particular embodiments of the invention, where the etching mask is a polymer etching mask, the polymer may be patterned with a 248 nm laser. Characteristics of the etching process may be taken into account in designing the characteristics of the mask 310 to provide a desired three-dimensional geometric pattern in the wafer 100'. For example, the differences in etch rate between the mask material and the silicon carbide wafer may be taken into account when the mask is patterned.

Because the patterning of the etching mask is provided for by laser patterning, the shape of the etching mask may be readily adjusted through control of the laser mask. Thus, for example, the shape of the etching mask may take into account the 6 to 1 etching rate of the etching mask to the silicon carbide and the features adjusted accordingly. Such an adjustment of mask characteristics may be difficult to provide without the use of laser patterning of the etching mask. Furthermore, through utilization of laser patterning, multiple geometries, e.g., pyramids and lenses can be formed in a single step with scanning image technique by designing them into the laser mask.

Additionally, the surface of the wafer after the etch may be rough or smooth. A roughened surface may be provided, for example, by placing a thin layer of material, such as aluminum, between the etch mask and the substrate to create a micro-mask. When etched, the micro-mask may act to roughen a surface of the wafer 100'.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of processing a semiconductor wafer to form a light emitting device, comprising:

forming a plurality of Light Emitting Devices (LED) on a semiconductor wafer having a first thickness;

contacting the plurality of LEDs on the wafer to a surface of a carrier to couple the wafer to the carrier;

reducing the first thickness of the wafer to a second thickness that is less than the first thickness by processing a backside surface of the wafer;

separating the carrier from the plurality of LEDs on the wafer; and cutting the wafer to separate the plurality of LEDs, wherein reducing the first thickness of the wafer to a second thickness is followed by:

processing the backside surface of the wafer opposite the plurality of LEDs to improve light extraction wherein processing comprises laser patterning the backside surface; and forming a plurality of respective contacts on the backside surface opposite where respective bonding pads are to be formed on the plurality of LEDs.

2. A method according to claim 1 wherein the first thickness comprises a thickness from about 250 μm to about 400 μm.

3. A method according to claim 1 wherein reducing the first thickness of the wafer comprises grinding, lapping, and/or etching the backside of the wafer to reduce the first thickness of the wafer to the second thickness of less than about 150 μm.

4. A method according to claim 1 wherein reducing the first thickness of the wafer comprises grinding, lapping, and/or etching the backside of the wafer to reduce the first thickness of the wafer to the second thickness of less than about 120 μm.

5. A method according to claim 4 wherein grinding the backside of the wafer comprises grinding the backside of the wafer using an in-feed grinder or a creep feed grinder.

6. A method according to claim 1 wherein cutting the wafer comprises cutting the wafer using a saw blade to form straight edges on the separated plurality of LEDs.

7. A method according to claim 1 wherein cutting the wafer comprises:

cutting score lines on the wafer to form beveled grooves between the plurality of LEDs on the wafer; and separating the plurality of LEDs on the wafer from one another along the score lines.

8. A method according to claim 1 wherein cutting the wafer comprises cutting the wafer with a saw blade to depth beneath a surface of the wafer of less than about a length of a beveled tip of the saw blade.

9. A method according to claim 8 wherein the depth comprises less than about 120 μm.

10. A method according to claim 1 wherein forming a plurality of respective contacts comprises forming a plurality of ohmic contacts using laser annealing.

11. A method according to claim 1 wherein separating the carrier from the plurality of LEDs on the wafer comprises heating, melting or dissolving an adhesive layer sufficient to cause separation of the plurality of LEDs from the carrier.

12. A method according to claim 1 wherein the wafer comprises a Silicon Carbide or sapphire wafer.

13. A method according to claim 1 wherein processing the backside surface of the wafer comprises patterning the backside surface of the wafer using a laser to form multiple three-dimensional geometric patterns on the backside surface.

14. A method of processing a semiconductor wafer to form a light emitting device, comprising:
- forming a plurality of Light Emitting Devices (LED) on a semiconductor wafer having a first thickness;
- contacting the plurality of LEDs on the wafer to a surface of a carrier to couple the wafer to the carrier;
- reducing the first thickness of the wafer to a second thickness that is less than the first thickness by processing a backside surface of the wafer;
- separating the carrier from the plurality of LEDs on the wafer;
- cutting the wafer to separate the plurality of LEDs, wherein reducing the first thickness of the wafer to a second thickness is followed by:
- processing the backside surface of the wafer opposite the plurality of LEDs to improve light extraction; and
- forming a plurality of respective contacts on the backside surface opposite where respective bonding pads are to be formed on the plurality of LEDs, wherein forming a plurality of respective contacts comprises forming a plurality of ohmic contacts using laser annealing.

15. A method according to claim 14 wherein the first thickness comprises a thickness from about 250 µm to about 400 µm.

16. A method according to claim 14 wherein reducing the first thickness of the wafer comprises grinding, lapping, and/or etching the backside of the wafer to reduce the first thickness of the wafer to the second thickness of less than about 150 µm.

17. A method according to claim 14 wherein reducing the first thickness of the wafer comprises grinding, lapping, and/or etching the backside of the wafer to reduce the first thickness of the wafer to the second thickness of less than about 120 µm.

18. A method according to claim 17 wherein grinding the backside of the wafer comprises grinding the backside of the wafer using an in-feed grinder or a creep feed grinder.

19. A method according to claim 14 wherein cutting the wafer comprises cutting the wafer using a saw blade to form straight edges on the separated plurality of LEDs.

20. A method according to claim 14 wherein cutting the wafer comprises: cutting score lines on the wafer to form beveled grooves between the plurality of LEDs on the wafer; and
- separating the plurality of LEDs on the wafer from one another along the score lines.

21. A method according to claim 14 wherein cutting the wafer comprises cutting the wafer with a saw blade to depth beneath a surface of the wafer of less than about a length of a beveled tip of the saw blade.

22. A method according to claim 21 wherein the depth comprises less than about 120 µm.

23. A method according to claim 14 wherein separating the carrier from the plurality of LEDs on the wafer comprises heating, melting or dissolving an adhesive layer sufficient to cause separation of the plurality of LEDs from the carrier.

24. A method according to claim 14 wherein the wafer comprises a Silicon Carbide or sapphire wafer.

25. A method according to claim 14 wherein processing the backside surface of the wafer comprises patterning the backside surface of the wafer using a laser to form multiple three-dimensional geometric patterns on the backside surface.

* * * * *